United States Patent
Halliyal et al.

(10) Patent No.: US 7,670,936 B1
(45) Date of Patent: Mar. 2, 2010

(54) NITRIDATION OF GATE OXIDE BY LASER PROCESSING

(75) Inventors: Arvind Halliyal, Cupertino, CA (US);
Nicholas H. Tripsas, San Jose, CA (US);
Mark T. Ramsbey, Sunnyvale, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 1341 days.

(21) Appl. No.: 10/273,184

(22) Filed: Oct. 18, 2002

(51) Int. Cl.
*H01L 21/425* (2006.01)

(52) U.S. Cl. .............. 438/514; 438/585; 257/21.427 E

(58) Field of Classification Search ............... 438/585, 438/653, 655, 651, 528, 305, 149, 151, 432, 438/514, 522; 257/E21.427
See application file for complete search history.

(56) References Cited

U.S. PATENT DOCUMENTS

| | | | | |
|---|---|---|---|---|
| 4,931,405 A | * | 6/1990 | Kamijo et al. | 438/143 |
| 5,237,188 A | * | 8/1993 | Iwai et al. | 257/325 |
| 5,466,617 A | * | 11/1995 | Shannon | 438/155 |
| 5,837,598 A | * | 11/1998 | Aronowitz et al. | 438/532 |
| 5,840,626 A | * | 11/1998 | Ohguro | 438/649 |
| 6,288,435 B1 | * | 9/2001 | Mei et al. | 257/458 |
| 6,432,758 B1 | * | 8/2002 | Cheng et al. | 438/166 |
| 6,436,739 B1 | * | 8/2002 | Wickboldt et al. | 438/149 |
| 6,462,976 B1 | * | 10/2002 | Olejniczak et al. | 363/147 |
| 6,531,368 B1 | * | 3/2003 | Yu | 438/306 |
| 6,531,724 B1 | * | 3/2003 | Furukawa et al. | 257/288 |
| 6,734,081 B1 | * | 5/2004 | Puchner et al. | 438/432 |
| 6,780,789 B1 | * | 8/2004 | Yu et al. | 438/764 |
| 2004/0108566 A1 | * | 6/2004 | Himi et al. | 257/499 |

* cited by examiner

*Primary Examiner*—Davienne Monbleau
*Assistant Examiner*—Hoa B Trinh
(74) *Attorney, Agent, or Firm*—McDermott Will & Emery LLP

(57) ABSTRACT

A method of manufacturing a semiconductor device includes forming an interface layer, a nitrided gate dielectric, a gate electrode, and source drain regions. The interface layer is formed in a substrate by laser processing. The nitrided gate dielectric is formed over the interface layer by laser processing. The gate electrode is formed over the substrate and the gate dielectric after the laser processing step, and source/drain regions are formed in the substrate proximate to the gate electrode.

7 Claims, 4 Drawing Sheets

NITRIDATION OF GATE OXIDE BY LASER PROCESSING

FIELD OF THE INVENTION

The present invention relates to the manufacturing of semiconductor devices, and more particularly, to laser thermal processes having improved efficiency.

BACKGROUND OF THE INVENTION

Over the last few decades, the semiconductor industry has undergone a revolution by the use of semiconductor technology to fabricate small, highly integrated electronic devices, and the most common semiconductor technology presently used is silicon-based. A large variety of semiconductor devices have been manufactured having various applications in numerous disciplines. One silicon-based semiconductor device is a metal-oxide-semiconductor (MOS) transistor. The MOS transistor is one of the basic building blocks of most modern electronic circuits. Importantly, these electronic circuits realize improved performance and lower costs, as the performance of the MOS transistor is increased and as manufacturing costs are reduced.

A typical MOS semiconductor device includes a semiconductor substrate on which a gate electrode is disposed over a gate dielectric. The gate electrode, which acts as a conductor, receives an input signal to control operation of the device. Source and drain regions are typically formed in regions of the substrate adjacent the gate electrodes by doping the regions with a dopant of a desired conductivity. The conductivity of the doped region depends on the type of impurity used to dope the region. The typical MOS transistor is symmetrical, in that the source and drain are interchangeable. Whether a region acts as a source or drain typically depends on the respective applied voltages and the type of device being made. The collective term source/drain region is used herein to generally describe an active region used for the formation of either a source or drain.

The gate electrode is typically formed from polysilicon, and the resistivity of the polysilicon gate conductor is reduced by the introduction of impurities. After sufficient dopants are introduced into the gate electrode, the sheet resistance of the gate electrode can be reduced, in some instances, to less than approximately 500 ohms per square. When the dopants are introduced using an ion implantation process, the depth at which the dopants are implanted can be controlled by adjusting the energy provided to the ions by the ion implantation equipment. However, the minimum depth of implantation is limited to between about 200 and 400 angstroms because the energy of each ion is typically too large to permit a lesser depth of implantation.

Subsequent processing steps may require heating of the semiconductor topography. For example, a post-doping anneal is often performed to position and activate the dopants implanted into the source/drain regions and the gate electrode. Dopants with a high diffusivity typically migrate to greater depths within the polysilicon gate electrode than dopants with a lower diffusivity. For example, boron, which is commonly used to dope the polysilicon gate and the source/drain regions of an PMOS device, undergoes fast diffusion. On the other hand, arsenic, which is typically used to dope the polysilicon gate and the source/drain regions of a NMOS device, diffuses more slowly.

One problem with dopants, like boron, which readily migrate during heat treatment, are that the dopants may diffuse from the gate electrode, through the gate dielectric, and into a channel region of the transistor. The penetration of boron into the channel region can lead to undesirable effects. These effects include an increase in electron trapping, a decrease in low-field hole mobility, degradation of the transistor drive current, and increased sub-threshold current.

In an attempt to prevent the diffusion of impurities into the channel region, barrier atoms have been incorporated into the gate dielectric/channel interfacial region. For example, nitrogen is commonly introduced into the interfacial region by annealing the semiconductor topography in an ambient that includes NO, $N_2O$ or $NH_3$ at temperatures between about 700 to 1000° C. Available N atoms may react with Si atoms and O atoms of the gate dielectric to form silicon oxynitride ("oxynitride") to thereby terminate dangling bonds within the gate oxide. The presence of strong N—O bonds of oxynitride throughout the gate oxide also serve to reduce the entrapment of hot carriers within the gate oxide. Furthermore, single N atoms can block the migration pathways into and through the gate dielectric, thereby inhibiting fast diffusing impurities from passing from the gate electrode into the channel region.

Ion implantation of N atoms into the gate dielectric/channel interfacial region has also been employed as a barrier to hot carriers or to prevent species from passing into and out of the gate dielectric. Ion implantation involves accelerating the ions in an electric field to increase the energy of each ion to greater than 10 keV. Absent the ability to achieve lower energies for the ions, the ions are doped into a medium to a minimum depth of between about 200 and 400 angstroms. Accordingly, atoms implanted into the gate oxide are positioned and thereafter tend to migrate well below the gate dielectric/channel interface. These atoms, therefore, fill no interstitial and vacancy positions within the critical gate dielectric. Therefore, the atoms provide little, if any, barrier against the migration of impurities from the gate electrode into the channel and to the injection of hot carriers into the gate dielectric. Accordingly, a need exists for a more effective method for forming a diffusion barrier between the gate electrode and the channel region of a transistor to prevent the migration of dopants into the channel region and/or hot carriers into the gate dielectric.

SUMMARY OF THE INVENTION

This and other needs are met by embodiments of the present invention which provide a method of manufacturing a semiconductor device that reduces the total time used in forming a nitrided gate oxide and reduces the amount of heat to which the semiconductor device is subjected. The method includes forming an interface layer, the nitrided gate dielectric, a gate electrode, and source drain regions. The interface layer is formed in a substrate by laser processing. The nitrided gate dielectric is formed over the interface layer by laser processing. The gate electrode is formed over the substrate and the gate dielectric after the laser processing step, and source/drain regions are formed in the substrate proximate to the gate electrode.

By forming the nitrided gate dielectric using laser processing, a faster process can be provided. Furthermore, the laser can selectively irradiate only certain portions of the semiconductor device to reduce the amount of heat absorbed by the semiconductor device during processing. In one aspect of the present invention, the nitrided gate dielectric is formed by forming a gate dielectric and then laser thermal annealing the gate dielectric in an ambient that includes $N_2$, NO, $N_2O$ or $NH_3$. Alternatively, the nitrided gate dielectric can be advantageously formed in a single step in which the substrate is laser thermal oxidized in an ambient that includes gas containing nitrogen species and oxygen.

Additional advantages of the present invention will become readily apparent to those skilled in this art from the following detailed description, wherein only the preferred embodiment of the present invention is shown and described, simply by way of illustration of the best mode contemplated for carrying out the present invention. As will be realized, the present invention is capable of other and different embodiments, and its several details are capable of modifications in various obvious respects, all without departing from the invention. Accordingly, the drawings and description are to be regarded as illustrative in nature, and not as restrictive.

BRIEF DESCRIPTION OF THE DRAWINGS

Reference is made to the attached drawings, wherein elements having the same reference numeral designations represent like elements throughout, and wherein.

DETAILED DESCRIPTION OF THE INVENTION

The present invention improves, at least in part, the efficiency of forming a nitrided gate dielectric. This is achieved, in part, by forming the nitrided gate dielectric using laser processing. In so doing, the semiconductor device can be subjected to a reduced heat load and the formation of the nitrided gate dielectric can be performed in fewer and/or faster steps. Furthermore, a thinner gate dielectric can be provided through the use of laser processing.

An embodiment of the present invention is illustrated in FIGS. 1A-1F. A substrate is provided and can be formed from any material suitable for integrated circuit manufacture. However, in one aspect, the substrate is formed from single-crystal silicon, with a <100> crystallographic orientation and which has been slightly doped with n-type or p-type impurities. Separate semiconductor devices are separated on the silicon substrate using isolation structures, such as a field oxide or a shallow isolation trench (not shown).

A shallow isolation trench, for example, can be formed by etching either isotropically with wet techniques or anisotropically with dry etch techniques. An oxide is thereafter deposited within the trench. As an alternative to the shallow isolation trench, a field oxide can be formed. A field oxide is typically formed via thermal oxidation in an oxygen-steam ambient at temperatures between about 850 and 1050° C. A patterned, oxidation-resistant mask can be used to prevent oxidation of non-isolation device regions. After formation of the field oxide, the mask is removed using known techniques, for example hot phosphoric acid for a silicon nitride mask or buffered hydrofluoric acid for a pad oxide mask.

Figure 1A:
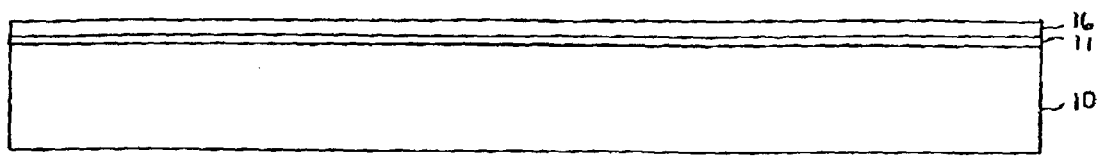
FIGS. 1A-1F schematically illustrate sequential phases of a semiconductor device fabrication method using a laser thermal process according to an embodiment of the present invention.
Figure 1B:
Figure 1B:
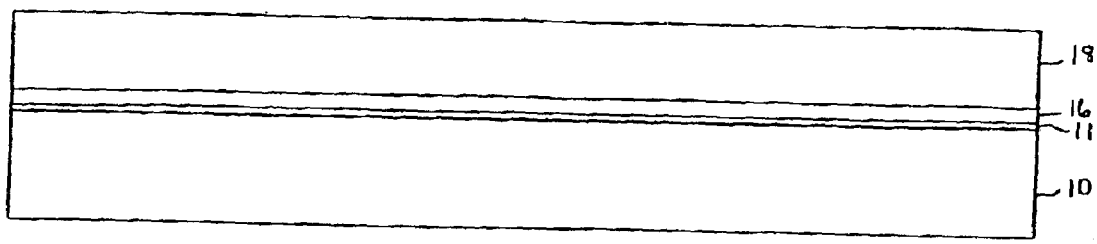

In FIG. 1A, although not necessary for practicing the invention, prior to forming a gate dielectric 16, the surface of the substrate 10 can be prepared using laser processing. The preparation of the surface of the substrate 10 can remove contaminants from and reduce disparities in elevation in the surface of substrate 10. Oxides subsequently formed on a rough silicon surface are generally of a lower quality than oxides grown under identical conditions on a smoother silicon surface. Therefore, by laser processing the upper surface of substrate 10, the relative uniformity of a subsequently grown gate dielectric 16 can be improved.

The preparation of the surface of the substrate 10 by laser processing involves irradiating the substrate 10 with a laser to melt a portion of the substrate 10. The energy from the laser can also volatilize contaminants from the surface of the substrate. An example of a laser capable of providing this energy is a spatially homogenized 308 nm XeCl pulsed laser, although the invention is not limited in this manner. After the silicon substrate has been melted, which is for approximately 30-100 nanoseconds, the silicon will cool rapidly, within about one microsecond, and the silicon will reform epitaxially to form an interface layer 11. Properties of the interface layer 11 include reduced contaminants, a smoother profile, and a crystalline structure with less defects, as compared to an untreated portions of the surface of the substrate. Although not limited in this manner, the thickness of the interface layer 11 can be between about 10 and 200 angstroms.

After formation of the interface layer 11 in the substrate 10, a nitrided gate dielectric 16 is formed on the top surface of the substrate 10 using laser processing, such as annealing or oxidation. The gate dielectric 16 is not limited as to a particular material. For example, the gate dielectric 16 can be formed from silicon dioxide, nitrided $SiO_2$, stacks of $SiO_2/Si_3N_4$, or other materials suitable for use as a gate dielectric 16. The nitride can be formed using a low pressure chemical vapor deposition (LPCVD) bath process or a RTCVD process in a single wafer tool. A mixture of $H_2$ and $O_2$ can be used to form the gate dielectric 16 using a process commonly known as in-situ steam generation (ISSG).

Although not limited in this manner, the gate dielectric 16 can have a thickness less than 200 angstroms. The desired thickness will depend on the design rules employed for the semiconductor device being fabricated. However, in certain aspects, the method is used to provide an ultra-thin gate dielectric 16, which has a thickness less than 20 angstroms. The invention is not limited in the manner in which the nitrided gate dielectric 16 is formed using laser thermal annealing. For example, two methods of forming the gate dielectric 16 are illustrated in FIGS. 2 and 3.

Figure 2:
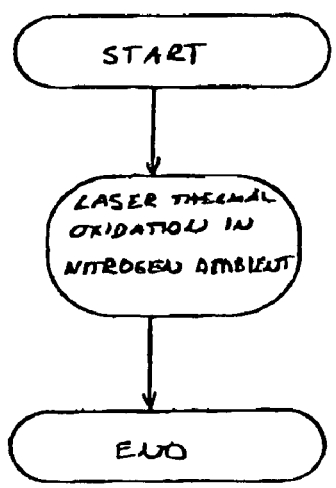
FIG. 2 is a schematic diagram illustrating a process for forming a nitrided gate dielectric according to an embodiment of the present invention.

In FIG. 2, the nitrided gate dielectric 16 is formed by oxidizing the substrate 10 in a nitrogen atmosphere using a laser thermal oxidation process. The process is not limited as to the oxidant used, and examples of acceptable oxidants include oxygen ($O_2$), steam ($H_2O$), ozone ($O_3$), oxygen plasma, or nitrous oxide ($N_2O$). The process is also not limited as to the source of nitrogen. For example, the source of nitrogen can be from ammonium ($NH_3$), nitric oxide (NO) or nitrous oxide ($N_2O$), or combinations thereof. As those skilled in the art will recognize, the presence of nitric oxide or nitrous oxide during the oxidation process tends to reduce the oxidation rate, thereby allowing the gate dielectric 16 to be grown thinner than if it were grown in the presence of oxygen. The gases (NO, $N_2O$ or $NH_3$) for nitridation of the gate dielectric 16 can be chosen to be introduced only during a part of the oxidation process so as to engineer the depth profile of the nitrogen in the gate dielectric. For example, the gases can be introduced only initially so as to create a nitrided interface.

Figure 3:
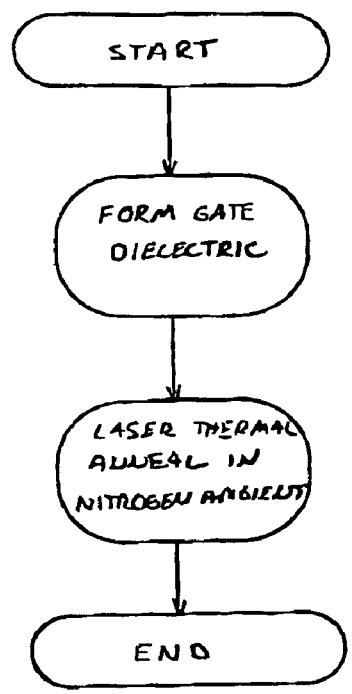
FIG. 3 is a schematic diagram illustrating an alternative process for forming the nitrided gate dielectric according to an embodiment of the present invention.

In FIG. 3, the gate dielectric 16 is formed using any conventional method after which the gate dielectric is laser thermal annealed in the presence of nitrogen. An exemplary method of forming the gate dielectric involves subjecting the substrate 10 to thermal oxidation at temperatures between about 700 and 1000° C. in an oxygen or steam ambient. In an alternative process, the gate dielectric 16 is formed using a plasma enhanced chemical vapor deposition process with a source of oxygen. The resultant oxygen plasma reacts directly with the silicon substrate 10 to form $SiO_2$. PECVD uses an RF-induced glow discharge to transfer energy to the source gas, thereby permitting deposition temperatures lower than those utilized in other CVD techniques and thermal oxidation.

After the gate dielectric 16 is formed, the gate dielectric 16 is laser thermal annealed in the presence of a nitrogen containing ambient. For example, this laser thermal annealing can be performed in the presence of ammonium ($NH_3$), nitric oxide (NO), nitrous oxide ($N_2O$), or combinations thereof. A laser capable of being used in this process is a spatially homogenized 308 nm XeCl pulsed laser, although the invention is not limited in this manner. The process parameters to be varied include energy fluence, and energy fluence can be modified by adjusting the power or wattage of the pulses, the number of pulses of the laser, and/or the length of the pulses. The energy and power of the laser can vary in accordance with different applications. For example, the fluence range for laser irradiation can extend from about 1 $mJ/cm^2$ to about 1.3 $J/cm^2$.

By forming a nitrided gate dielectric 16 using laser thermal annealing, the gate dielectric 16 can be provided with strong N—O bonds, which reduce the entrapment of hot carriers within the gate dielectric 16, and also single nitrogen atoms, which block the migration pathways into and through the gate dielectric 16, thereby inhibiting fast diffusing impurities from passing from the gate into the channel region. The laser thermal annealing process also allows for selective irradiation and heating of certain portions of the semiconductor device and allows for a faster process.

After the nitrided gate dielectric 16 has been formed, the invention is not limited as to the particular type of semiconductor device to be formed with the nitrided gate dielectric 16 or the manner in which the semiconductor device is formed after formation of the nitrided gate dielectric 16 by laser processing. For example, in FIG. 1B, the formation process for a gate electrode is initiated. Although the gate electrode is not limited as to a particular material, in a current aspect of the invention, the formation of a gate electrode involves depositing a blanket layer of undoped polysilicon 18, for example by low pressure chemical vapor deposition (LPCVD) at temperatures from about 600 to 800° C., on the top surface of gate dielectric 16. Although not limited in this manner, the polysilicon layer 18 can have a thickness from about 100 to 2500 angstroms. The polysilicon layer 18 can then be doped with ions, such as nitrogen, boron, and arsenic, as depicted by arrows 20. The doping of the ions can be at a dosage from about $5 \times 10^{14}$ to $5 \times 10^{15}$ dopants/$cm^2$ and at an energy level from about 20 to 200 keV.

Figure 1C:
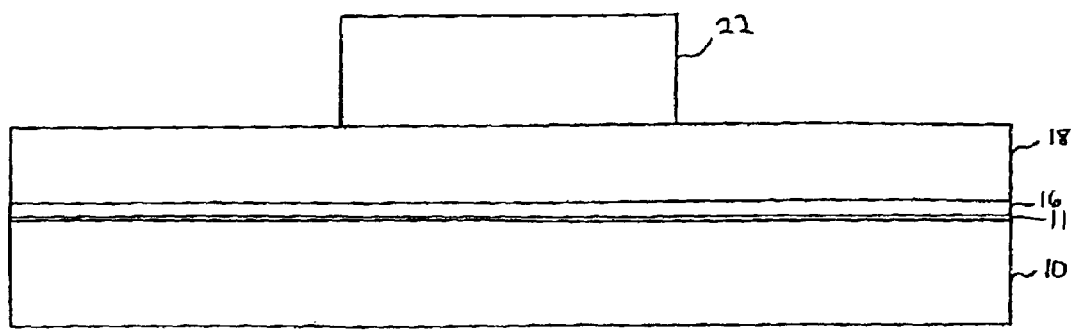

In FIG. 1C, the layers over the substrate 10 are etched to form the gate electrode. The etching of the gate typically involves forming a photoresist 22 on the polysilicon layer 18, and the photoresist 22 is selectively irradiated using a photolithographic system, such as a step and repeat optical projection system, in which ultraviolet light from a mercury-vapor lamp is projected through a first reticle and a focusing lens to obtain a first image pattern. The photoresist 22 is then developed, and the irradiated portions of the photoresist 22 are removed to provide openings in the photoresist 22. The openings expose portions of the polysilicon layer 18, which will thereby define the gate electrode.

Figure 1D:
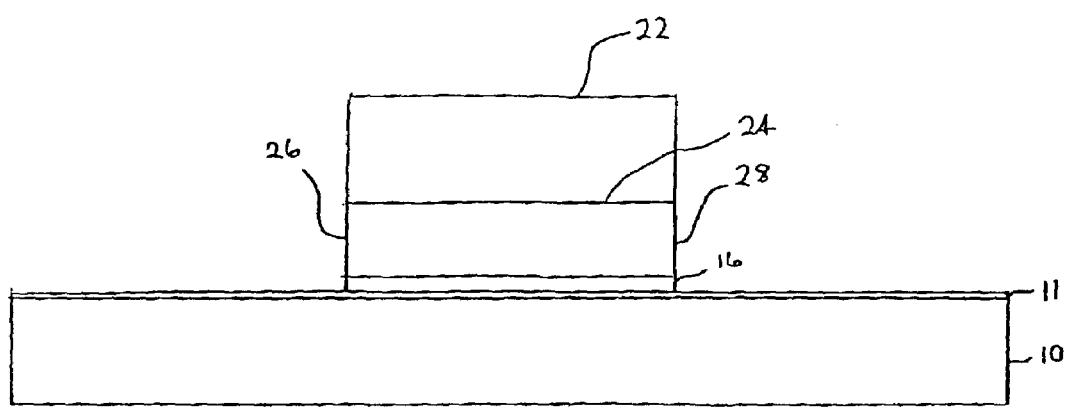

In FIG. 1D, an etch, typically anisotropic, is applied to remove the exposed portions of the polysilicon layer 18 and the underlying portions of the gate dielectric 16. After etching, the remaining portion of the polysilicon layer 18 provides a gate electrode 24 having opposing vertical sidewalls 26, 28. Although not limited in this manner, the width of the gate electrode 24 between the sidewalls 26, 28 can be between about 100 and 2500 angstroms.

Figure 1E:
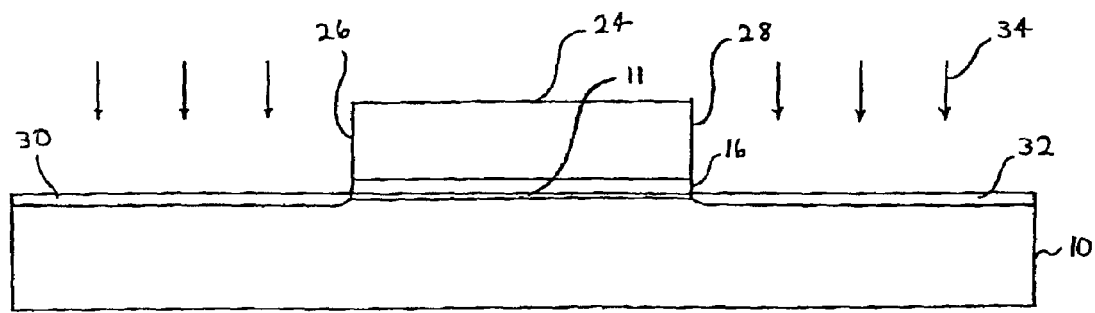

In FIG. 1E, the photoresist 22 is stripped, and lightly doped (LDD) source/drain extensions 30, 32 are formed by doping, as represented by arrows 34. The doping may be with an n-type dopant, such as arsenic or phosphorus, if an NMOSFET is desired, or with a p-type dopant, such as boron, if a PMOSFET is desired. Illustrative examples of implant energies and dosages for doping respectively range from about 2 to 20 keV and from about $5 \times 10^{14}$ to $3 \times 10^{15}$ dopants/$cm^2$. The source/drain extensions 30, 32 are formed within the substrate 10 immediately adjacent to the sidewalls 26, 28 and are self-aligned with the gate electrode 24. After doping, annealing is conducted to activate the source/drain extensions 30, 32 and to recrystallize the extensions. Alternatively, the annealing can occur after formation of the source/drain regions. Typically, the source/drain extensions 30, 32 extend down from the surface of the silicon substrate 10 to a depth of about 50 angstroms to 300 angstroms.

Figure 1F:
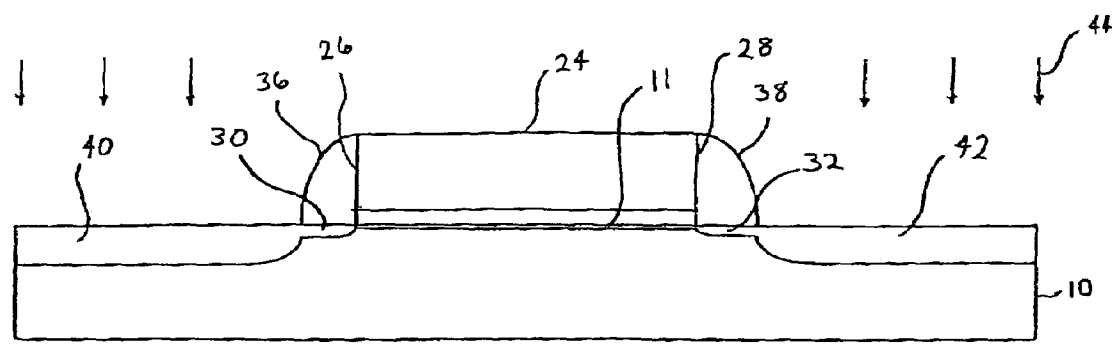

In FIG. 1F, sidewall spacers 36, 38 are formed following the doping of the source/drain extensions 30, 32. Formation of the sidewall spacers 36, 38 involves blanket depositing a spacer material over the substrate 10. The spacer material can be silicon nitride, deposited silicon oxide or some other material such as plasma-enhanced oxide (PEOX) or tetraethoxysilane (TEOS) oxide. The blanket deposition is followed by an anisotropic etch, which removes the spacer material except for the sidewall spacers 36, 38 immediately adjacent to the sidewalls 26, 28 of the gate electrode 24 and over the substrate 10.

After formation of the sidewall spacers 36, 38, heavily doped (HDD) or moderately doped (MDD) source/drain regions 40, 42 are formed by a second ion doping, as represented by arrows 44. The source/drain regions 40, 42 are formed within the substrate 10 and extend past the source/drain extensions 30, 32 immediately adjacent to the sidewall spacers 36, 38. The sidewall spacers 36, 38 act as masks, which protect portions of the source/drain extensions 30, 32 from being heavily doped. Illustrative examples of implant energies and dosages for doping respectively range from about 0.5 keV to 60 keV and from about $1 \times 10^{14}$ to $5 \times 10^{15}$ dopants/$cm^2$.

After doping of the source/drain regions 40, 42, the source/drain regions 40, 42 are activated, and any method of activating the source/drain regions 40, 42 is acceptable for use with the invention. For example, the source/drain regions can be activated by rapid thermal annealing or with a laser thermal annealing process. Although not limited in this manner, the source/drain regions 40, 42 typically extend down from the surface of the silicon substrate 10 to a final depth of about 400 angstroms to about 1000 angstroms, although ultra-shallow junctions can have depths of about 100 angstroms to about 200 angstroms.

The present invention can be practiced by employing conventional materials, methodology and equipment. Accordingly, the details of such materials, equipment and methodology are not set forth herein in detail. In the previous descriptions, numerous specific details are set forth, such as specific materials, structures, chemicals, processes, etc., in order to provide a thorough understanding of the present invention. However, it should be recognized that the present invention can be practiced without resorting to the details specifically set forth. In other instances, well-known processing structures have not been described in detail, in order not to unnecessarily obscure the present invention.

Only the preferred embodiment of the present invention and but a few examples of its versatility are shown and described in the present disclosure. It is to be understood that the present invention is capable of use in various other combinations and environments and is capable of changes or modifications within the scope of the inventive concepts as expressed herein.

What is claimed is:

1. A method of manufacturing a semiconductor device, comprising the steps of:
   forming a nitrided gate dielectric over a substrate;
   laser processing the gate dielectric;
   forming a gate electrode over the substrate and the gate dielectric after the laser processing step; and
   forming an interface layer in the substrate by laser processing before forming the gate dielectric,
   wherein a surface of the interface layer is smoother than the surface of the substrate prior to forming the interface layer.

2. A method of manufacturing a semiconductor device, comprising the steps of:
   forming a nitrided gate dielectric over a substrate;
   laser processing the gate dielectric;
   forming a gate electrode over the substrate and the gate dielectric after the laser processing step; and
   forming an interface layer in the substrate by laser processing before forming the gate dielectric,
   wherein the thickness of the interface layer is between about 10 and 200 angstroms.

3. A method of manufacturing a semiconductor device, comprising the steps of:
   forming a nitrided gate dielectric over a substrate;
   laser processing the gate dielectric; and
   forming a gate electrode over the substrate and the gate dielectric after the laser processing step,
   wherein the step of forming a nitrided gate dielectric includes forming a gate dielectric without nitrogen by plasma enhanced chemical vapor deposition, and laser thermal annealing the gate dielectric with nitrogen in a nitrogen-containing ambient.

4. A method of manufacturing a semiconductor device, comprising the steps of:
   forming a nitrided gate dielectric over a substrate;
   laser processing the gate dielectric; and
   forming a gate electrode over the substrate and the gate dielectric after the laser processing step,
   wherein the step of forming a nitrided gate dielectric includes forming a gate dielectric without nitrogen, and laser thermal annealing the gate dielectric with nitrogen in a nitrogen-containing ambient, and the nitrogen-containing ambient includes a gas selected from the group consisting of ammonium, nitric oxide, nitrous oxide, and combinations thereof.

5. A method of manufacturing a semiconductor device, comprising the steps of:
   forming a nitrided gate dielectric over a substrate;
   laser processing the gate dielectric; and
   forming a gate electrode over the substrate and the gate dielectric after the laser processing step,
   wherein the nitrided gate dielectric is formed by laser thermal oxidation in an ambient including nitrogen, and the ambient includes a gas selected from the group consisting of ammonium, nitric oxide, nitrous oxide, and combinations thereof.

6. A method of manufacturing a semiconductor device, comprising the steps of:
   forming a nitrided gate dielectric over a substrate;
   laser processing the gate dielectric; and
   forming a gate electrode over the substrate and the gate dielectric after the laser processing step,
   wherein the nitrided gate dielectric is formed by laser thermal oxidation in an ambient including nitrogen, and the ambient includes an oxidant selected from the group consisting of oxygen, steam, ozone, oxygen plasma, nitrous oxide, nitric oxide and combinations thereof.

7. A method of manufacturing a semiconductor device, comprising the steps of:
   forming a nitrided gate dielectric over a substrate;
   laser processing the gate dielectric; and
   forming a gate electrode over the substrate and the gate dielectric after the laser processing step,
   wherein during the laser processing step, certain portions of the semiconductor device are exposed to the laser processing step and other portions are not exposed.

* * * * *